(12) United States Patent
Fan

(10) Patent No.: US 11,978,707 B2
(45) Date of Patent: May 7, 2024

(54) DISPLAY PANEL AND DISPLAY DEVICE

(71) Applicant: Shenzhen China Star Optoelectronics Semiconductor Display Technology Co., Ltd., Guangdong (CN)

(72) Inventor: Yong Fan, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 843 days.

(21) Appl. No.: 17/040,542

(22) PCT Filed: Aug. 4, 2020

(86) PCT No.: PCT/CN2020/106817
§ 371 (c)(1),
(2) Date: Sep. 23, 2020

(87) PCT Pub. No.: WO2022/007076
PCT Pub. Date: Jan. 13, 2022

(65) Prior Publication Data
US 2023/0107568 A1    Apr. 6, 2023

(30) Foreign Application Priority Data
Jul. 8, 2020   (CN) .......................... 202010653155.0

(51) Int. Cl.
*H01L 23/00*     (2006.01)
*B32B 7/02*      (2019.01)
(Continued)

(52) U.S. Cl.
CPC .............. *H01L 23/562* (2013.01); *B32B 7/02* (2013.01); *B32B 27/08* (2013.01); *B32B 27/281* (2013.01);
(Continued)

(58) Field of Classification Search
CPC . H01L 23/562; H01L 23/145; H01L 23/4985; H01L 25/0753; H01L 27/156; H01L 51/52; H01L 51/00; H01L 27/32; H01L 51/56; B32B 7/02; B32B 27/08; B32B 27/281; B32B 2255/20;
(Continued)

(56) References Cited

U.S. PATENT DOCUMENTS

| 2014/0145587 A1 | 5/2014 | Yoon |
| 2015/0028362 A1 | 1/2015 | Chan et al. |

(Continued)

FOREIGN PATENT DOCUMENTS

| CN | 104505467 | 4/2015 |
| CN | 107507927 | 12/2017 |

(Continued)

*Primary Examiner* — Mohammad A Rahman

(57) ABSTRACT

A display panel and a display device are provided. In the display panel, a material of the first flexible layer and a material of the second flexible layer are different, and a direction of an internal stress of the first flexible layer and a direction of an internal stress of the second flexible layer are opposite. Therefore, the internal stress of the first flexible layer and the internal stress of the second flexible layer may eliminate each other. As a result, the first flexible layer and the second flexible layer will not be curled, and warpage will not occur on the display panel.

18 Claims, 5 Drawing Sheets

(51) Int. Cl.
*B32B 27/08* (2006.01)
*B32B 27/28* (2006.01)
*H01L 23/14* (2006.01)
*H01L 23/498* (2006.01)
*H01L 25/075* (2006.01)

(52) U.S. Cl.
CPC ........ *H01L 23/145* (2013.01); *H01L 23/4985* (2013.01); *H01L 25/0753* (2013.01); *B32B 2255/20* (2013.01); *B32B 2307/402* (2013.01); *B32B 2307/732* (2013.01); *B32B 2457/20* (2013.01)

(58) Field of Classification Search
CPC ........ B32B 2307/402; B32B 2307/732; B32B 2457/20; B32B 2255/10; B32B 2307/546; Y02E 10/549; G09F 9/30
See application file for complete search history.

(56) References Cited

U.S. PATENT DOCUMENTS

| | | | |
|---|---|---|---|
| 2016/0079320 A1 | 3/2016 | Kim et al. | |
| 2020/0006703 A1* | 1/2020 | Zhang | H10K 59/122 |
| 2020/0220092 A1* | 7/2020 | Liu | H10K 71/00 |
| 2021/0184181 A1* | 6/2021 | Ding | H10K 71/80 |
| 2021/0234129 A1* | 7/2021 | Zhang | H10K 50/8445 |
| 2021/0376024 A1* | 12/2021 | Zheng | H10K 59/65 |

FOREIGN PATENT DOCUMENTS

| | | |
|---|---|---|
| CN | 109192878 | 1/2019 |
| CN | 109638178 | 4/2019 |
| CN | 110391294 | 10/2019 |
| CN | 110676292 | 1/2020 |
| CN | 111276052 A * | 2/2020 |
| CN | 111276052 | 6/2020 |

* cited by examiner

DISPLAY PANEL AND DISPLAY DEVICE

RELATED APPLICATIONS

This application is a National Phase of PCT Patent Application No. PCT/CN2020/106817 having International filing date of Aug. 4, 2020, which claims the benefit of priority of Chinese Patent Application No. 202010653155.0 filed on Jul. 8, 2020. The contents of the above applications are all incorporated by reference as if fully set forth herein in their entirety.

FIELD AND BACKGROUND OF THE INVENTION

The present disclosure relates to the field of display technologies, and more particularly, relates to a display panel and a display device.

Conventionally, a substrate of micro light-emitting diode (micro-LED) display panels is double layers of yellow polyimide. However, when the micro-LED display panels are manufactured, the double layers of yellow polyimide may be curled at high temperatures. Therefore, warpage of thin-film transistors may occur, resulting in warpage of the micro-LED display panels. Furthermore, the polyimide in a lower layer may be carbonized when laser is emitted on a glass. Conclusively, in conventional manufacturing processes, warpage may occur on the micro-LED display panels, and yellow polyimide may be curled and carbonized.

As a result, in conventional micro-LED display panels, yellow polyimide may be curled, resulting in warpage of the micro-LED display panels.

An embodiment of the present disclosure provides a display panel and a display device to solve following technical problems: in conventional micro-LED display panels, yellow polyimide may be curled, resulting in warpage of the micro-LED display panels.

SUMMARY OF THE INVENTION

To solve the above problems, technical solutions provided by the present disclosure are described below.

An embodiment of the present disclosure provides a display panel, including:
 a sacrificial layer;
 a first flexible layer disposed on the sacrificial layer;
 a first block layer disposed on the first flexible layer;
 a second flexible layer disposed on the first block layer;
 a second block layer disposed on the second flexible layer;
 a driving circuit layer disposed on the second block layer; and
 a small-sized light-emitting diode (LED) chip disposed on the driving circuit layer;
 wherein a material of the first flexible layer and a material of the second flexible layer are different, and a direction of an internal stress of the first flexible layer is opposite to a direction of an internal stress of the second flexible layer.

In some embodiments, the material of the first flexible layer includes yellow polyimide, and the material of the second flexible layer includes colorless polyimide.

In some embodiments, the material of the first flexible layer includes colorless polyimide, and the material of the second flexible layer includes yellow polyimide.

In some embodiments, a thickness of the first flexible layer is greater than or equal to a thickness of the second flexible layer.

In some embodiments, a material of the sacrificial layer includes one of silicon oxide, silicon nitride, amorphous silicon, or indium tin oxide.

In some embodiments, a thickness range of the sacrificial layer is one-tenth to one-fifth of a thickness of the first flexible layer.

In some embodiments, a barrier layer is disposed between the sacrificial layer and the first flexible layer.

In some embodiments, a thickness range of the barrier layer is one-tenth to one-fifth of a thickness of the first flexible layer.

In some embodiments, a material of the barrier layer includes silicon dioxide.

In some embodiments, a material of the first block layer includes at least one of silicon oxide or silicon nitride.

Furthermore, an embodiment of the present disclosure provides a display device, including a display panel and a cover plate, wherein the display panel includes:
 a sacrificial layer;
 a first flexible layer disposed on the sacrificial layer;
 a first block layer disposed on the first flexible layer;
 a second flexible layer disposed on the first block layer;
 a second block layer disposed on the second flexible layer;
 a driving circuit layer disposed on the second block layer; and
 a small-sized light-emitting diode (LED) chip disposed on the driving circuit layer;
 wherein a material of the first flexible layer and a material of the second flexible layer are different, and a direction of an internal stress of the first flexible layer is opposite to a direction of an internal stress of the second flexible layer.

In some embodiments, the small-sized LED chip includes a micro light-emitting diode (micro-LED chip) or a mini light-emitting diode (mini-LED) chip.

In some embodiments, the material of the first flexible layer includes yellow polyimide, and the material of the second flexible layer includes colorless polyimide.

In some embodiments, the material of the first flexible layer includes colorless polyimide, and the material of the second flexible layer includes yellow polyimide.

In some embodiments, a thickness of the first flexible layer is greater than or equal to a thickness of the second flexible layer.

In some embodiments, a material of the sacrificial layer includes one of silicon oxide, silicon nitride, amorphous silicon, or indium tin oxide.

In some embodiments, a thickness range of the sacrificial layer is one-tenth to one-fifth of a thickness of the first flexible layer.

In some embodiments, a barrier layer is disposed between the sacrificial layer and the first flexible layer.

In some embodiments, a thickness range of the barrier layer is one-tenth to one-fifth of a thickness of the first flexible layer.

In some embodiments, a material of the barrier layer includes silicon dioxide.

Regarding the beneficial effects: an embodiment of the present disclosure provides a display panel and a display device. The display panel includes a sacrificial layer, a first flexible layer, a first block layer, a second flexible layer, a second block layer, and a driving circuit layer. The first flexible layer is disposed on the sacrificial layer, the first block layer is disposed on the first flexible layer, the second flexible layer is disposed on the first block layer, the second block layer is disposed on the second flexible layer, the driving circuit layer is disposed on the second block layer, and a small-sized LED chip is disposed on the driving circuit layer. A material of the first flexible layer and a material of the second flexible layer are different, and a direction of an internal stress of the first flexible layer is opposite to a direction of an internal stress of the second flexible layer. Therefore, when the display panel is manufactured, the internal stress of the first flexible layer and the internal stress of the second flexible layer eliminate each other, so that the first flexible layer and the second flexible layer will not be curled, and warpage will not occur on the display panel. In addition, due to the sacrificial layer, the first flexible layer is prevented from being carbonized. As a result, a following technical problem is solved: in conventional micro-LED display panels, yellow polyimide may be curled, resulting in warpage of the micro-LED display panels.

DESCRIPTION OF SPECIFIC EMBODIMENTS OF THE INVENTION

The present disclosure provides a display panel and a display device. Embodiments are further described below in detail with reference to accompanying drawings to make objectives, technical solutions, and effects of the present disclosure clearer and more precise. It should be noted that described embodiments are merely used to construct the present disclosure and are not intended to limit the present disclosure.

An aim of an embodiment of the present disclosure is to solve a following technical problem: in conventional micro-LED display panels, yellow polyimide may be curled, resulting in warpage of the micro-LED display panels.

Figure 1:
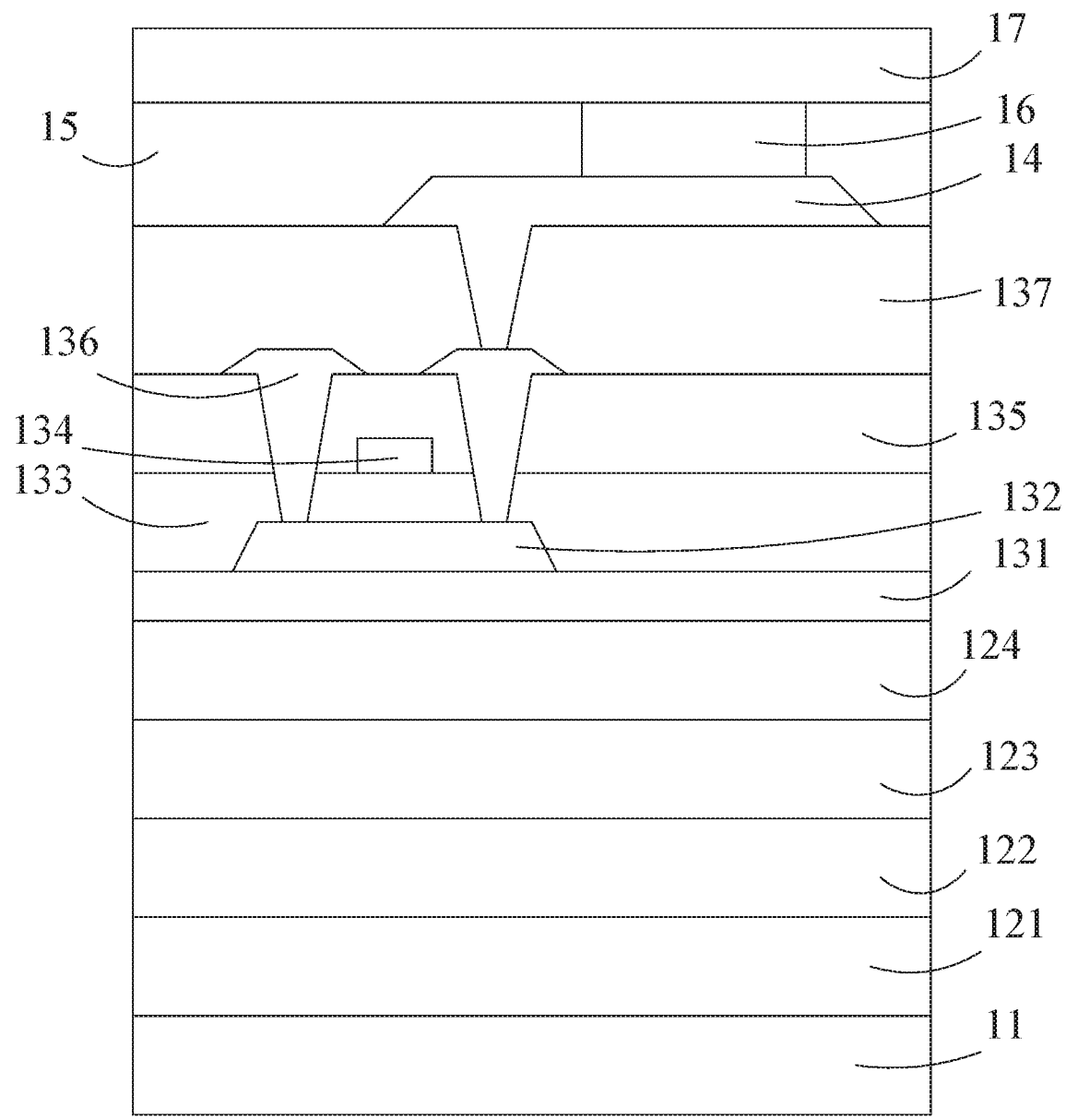
FIG. 1 is a schematic view showing a conventional micro-LED display panel.
Figure 2:
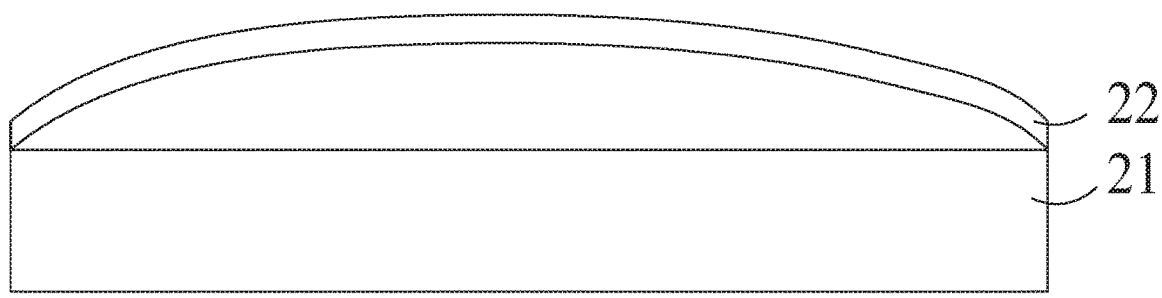
FIG. 2 is a schematic view showing warpage occurring on the conventional micro-LED display panel.
Figure 3:
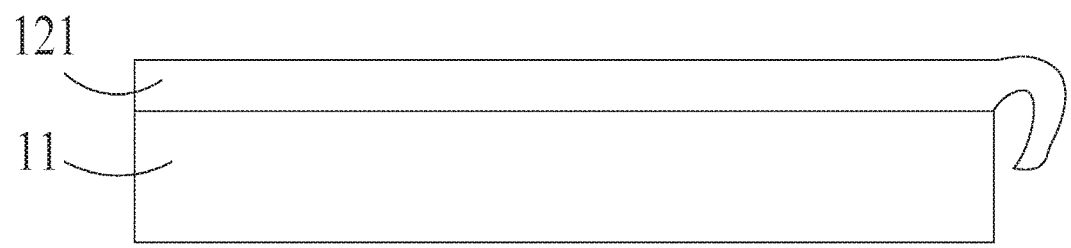
FIG. 3 is a schematic view showing a curled flexible layer of the conventional micro-LED display panel.

As shown in FIG. 1, a conventional micro-LED display panel includes a yellow polyimide layer 121, a first block layer 122, a yellow polyimide layer 123, a second block layer 124, a buffer layer 131, an active layer 132, a gate insulating layer 133, a gate layer 134, an interlayer insulating layer 135, a source/drain layer 136, a planarization layer 137, a pixel electrode layer 14, an insulating layer 15, a micro-LED 16, and a common electrode layer 17. When the micro-LED display panel is manufactured, a glass 11 is disposed under the yellow polyimide layer 121. However, manufacturing thin-film transistors requires high temperature, leading to warpage occurring on the above two yellow polyimide layers. As shown in FIG. 2, in manufacturing processes, warpage occurs on a glass substrate 22 on a carrier 21, resulting in breakage of the glass substrate 22 during other manufacturing processes of the glass substrate 22, and leading to failure of the glass substrate 22. Moreover, when the glass 11 is stripped off by laser, as shown in FIG. 3, the double layers of yellow polyimide are prone to curling, leading to poor flatness of the micro-LED display panel, which allows moisture and oxygen to easily enter the micro-LED display panel. Furthermore, when the glass is stripped off by laser, the yellow polyimide layer at the bottom is prone to being carbonized, resulting in bad flexibility of the polyimide layer. As a result, in conventional micro-LED display panels, yellow polyimide may be curled, resulting in warpage of the micro-LED display panels.

Figure 4:
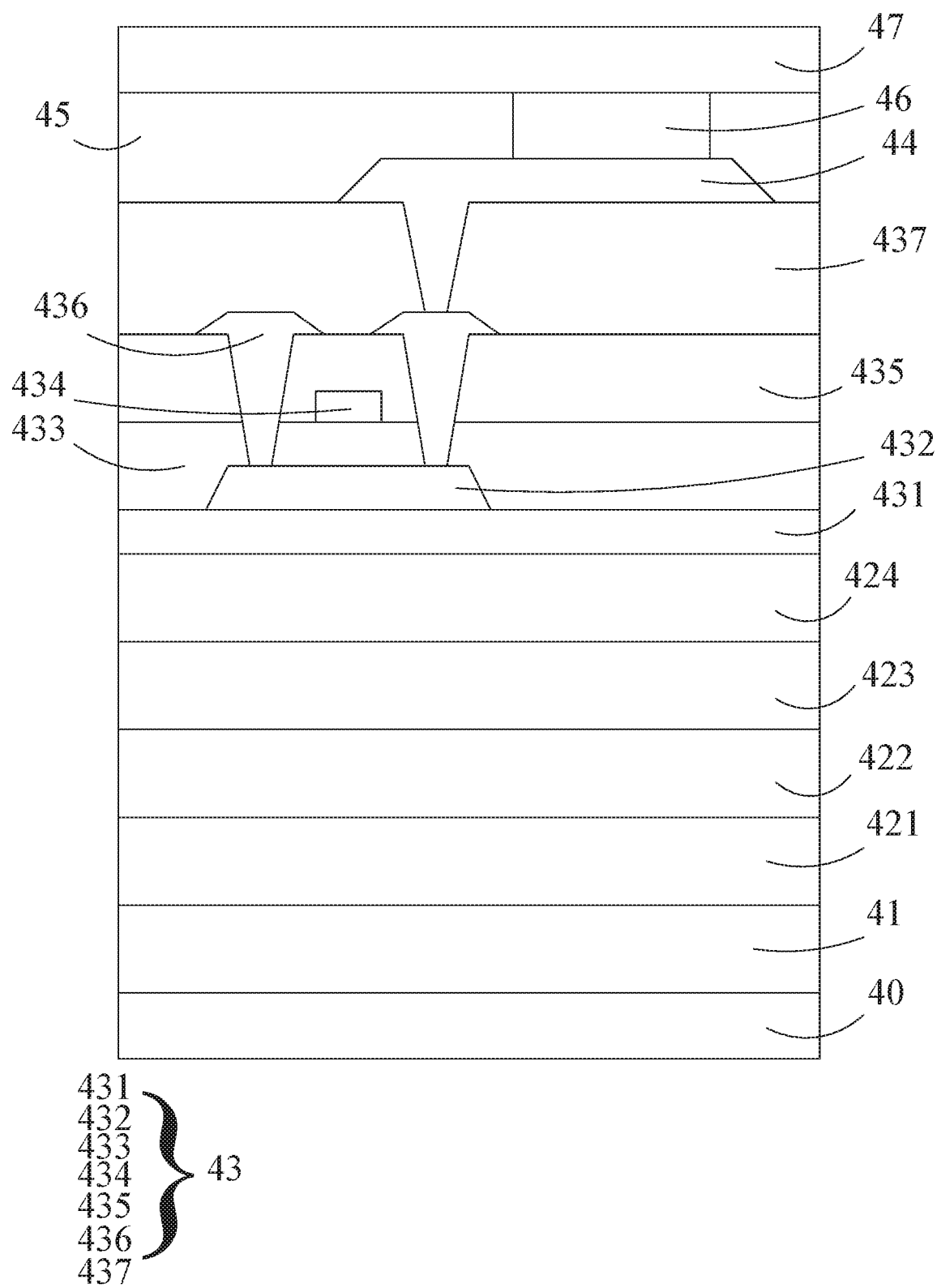
FIG. 4 is a schematic view showing a display panel provided by an embodiment of the present disclosure.

As shown in FIG. 4, an embodiment of the present disclosure provides a display panel, including:
a sacrificial layer 40;
a first flexible layer 421 disposed on the sacrificial layer 40;
a first block layer 422 disposed on the first flexible layer 421;
a second flexible layer 423 disposed on the first block layer 422;
a second block layer 424 disposed on the second flexible layer 423;
a driving circuit layer 43 disposed on the second block layer 424;
a small-sized light-emitting diode (LED) chip 46 disposed on the driving circuit layer 43;
wherein a material of the first flexible layer 421 and a material of the second flexible layer 423 are different, and a direction of an internal stress of the first flexible layer 421 is opposite to a direction of an internal stress of the second flexible layer 423.

An embodiment of the present disclosure provides a display panel, including a sacrificial layer, a first flexible layer, a first block layer, a second flexible layer, a second block layer, and a driving circuit layer. The first flexible layer is disposed on the sacrificial layer, the first block layer is disposed on the first flexible layer, the second flexible layer is disposed on the first block layer, the second block layer is disposed on the second flexible layer, the driving circuit layer is disposed on the second block layer, and a small-sized LED chip is disposed on the driving circuit layer. A material of the first flexible layer and a material of the second flexible layer are different, and a direction of an internal stress of the first flexible layer is opposite to a direction of an internal stress of the second flexible layer. Therefore, when the display panel is manufactured, the internal stress of the first flexible layer and the internal stress of the second flexible layer eliminate each other, so that the first flexible layer and the second flexible layer will not be curled, and warpage will not occur on the display panel. In addition, due to the sacrificial layer, the first flexible layer is prevented from being carbonized. As a result, a following technical problem is solved: in conventional micro-LED display panels, yellow polyimide may be curled, resulting in warpage of the micro-LED display panels.

Figure 5:
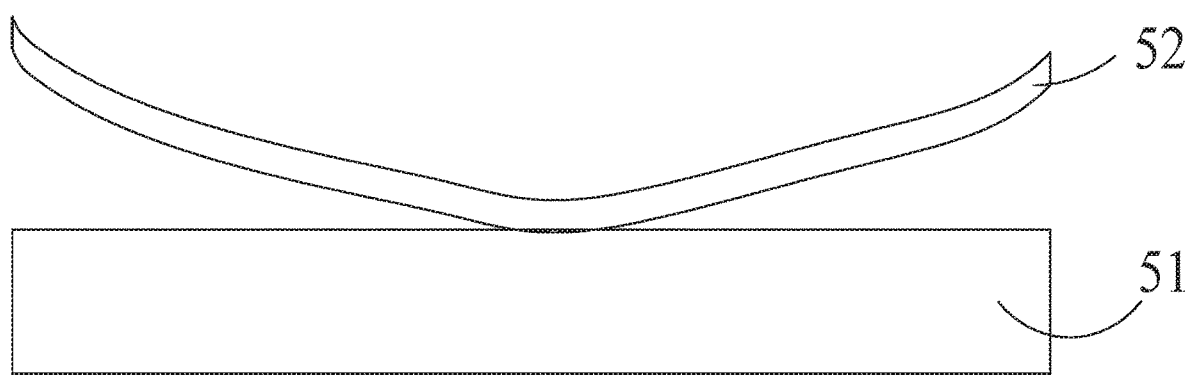
FIG. 5 is a schematic view showing warpage occurring on the display panel provided by the embodiment of present disclosure when a flexible layer of the display panel is made of colorless polyimide.

In one embodiment, the material of the first flexible layer is yellow polyimide, and the material of the second flexible layer is colorless polyimide. In conventional micro-LED display panels, the first flexible layer and the second flexible layer are made of yellow polyimide, leading to warpage of the micro-LED display panels. In the present embodiment, a direction of an internal stress of colorless polyimide is opposite to a direction of an internal stress of yellow polyimide. For example, as shown in FIG. 5, a warpage direction of a micro-LED display panel 52 having colorless polyimide on a carrier 51 is opposite to a warpage direction of a micro-LED display panel having double layers of yellow polyimide. In the present embodiment, given the above principles, the first flexible layer is designed to include yellow polyimide, and the second flexible layer is designed to include colorless polyimide. As a result, the direction of the internal stress of the first flexible layer is opposite to the direction of the internal stress of the second flexible layer. Therefore, when a plurality of thin-film transistors of the display panel is manufactured, the internal stress of the first flexible layer and the internal stress of the second flexible layer may eliminate each other, thereby preventing warpage from occurring on the first flexible layer and the second flexible layer. As such, the first flexible layer and the second flexible layer are prevented from being curled, and warpage is prevented from occurring on the display panel.

In one embodiment, the material of the first flexible layer is colorless polyimide, and the material of the second flexible layer is yellow polyimide. Specifically, to prevent warpage from occurring on the first flexible layer and the second flexible layer, which curls the first flexible layer and the second flexible layer, the first flexible layer may be colorless polyimide, and the second flexible layer may be yellow polyimide. As such, the internal stress of the first flexible layer and the internal stress of the second flexible layer may eliminate each other, thereby preventing warpage from occurring on the display panel.

In one embodiment, the first flexible includes a first area and a second area, a material of the first area is colorless polyimide, and a material of the second area is yellow polyimide. The second flexible layer includes a third area and a fourth area, a projection of the third area overlaps with a projection of the first area on the first block layer, and a projection of the fourth area overlaps with a projection of the second area on the first block area. A material of the third area is yellow polyimide, and a material of the fourth area is colorless polyimide. Specifically, as long as flatness and flexibility of the first flexible layer and the second flexible, and capability to block moisture and oxygen of the blocking layer are not affected, the first flexible layer may simultaneously include colorless polyimide and yellow polyimide, and the second flexible layer may correspondingly include colorless polyimide and yellow polyimide. Therefore, the internal stress of the first flexible layer and the internal stress of the second flexible layer may eliminate each other. In the present embodiment, an arrangement method of the material of the first flexible layer and an arrangement method of the material of the second flexible layer are not limited. Both the first flexible layer and the second flexible layer may include colorless polyimide and yellow polyimide which are alternately disposed.

In one embodiment, a thickness of the first flexible layer is greater than or equal to a thickness of the second flexible layer. When deciding on the thickness of the first flexible layer and the thickness of the second flexible layer, the thickness of the first flexible layer may be greater than or equal to the thickness of the second flexible layer. Given that the first flexible layer is disposed under the second flexible layer, the thickness of the first flexible layer may be greater than the thickness of the second flexible layer, thereby preventing the first block layer from being exposed when the first flexible is damaged. Moreover, flexibility of the display panel may be improved due to the first flexible layer. In addition, given that the direction of the internal stress of the first flexible layer and the direction of the internal stress of the second flexible layer are opposite, the thickness of the first flexible layer and the thickness of the second flexible layer may be the same. Therefore, the internal stress of the first flexible layer and the internal stress of the second flexible layer may also be the same and may eliminate each other. In actual processes, considering internal stresses of other layers, the thickness of the first flexible layer and the thickness of the second flexible layer may also be different. For example, the thickness of the first flexible layer is greater than the thickness of the second flexible layer, or the thickness of the first flexible layer is less than the thickness of the second flexible layer. As such, internal stresses of the entire display panel may be eliminated and warpage will not occur on the display panel.

In one embodiment, a material of the sacrificial layer includes one of silicon oxide, silicon nitride, amorphous silicon, or indium tin oxide. When the glass is stripped off by laser, the first flexible layer may be damaged by laser. Therefore, the sacrificial layer, including silicon oxide, silicon nitride, amorphous silicon, or indium tin oxide, may be disposed under the first flexible layer, thereby protecting the first flexible layer when the glass is stripped off by laser. As a result, the first flexible layer may be prevented from being curled or carbonized. Although the sacrificial layer may be damaged when the glass is stripped off by laser, the display panel can work normally because the damaged sacrificial layer will not affect the display panel. Furthermore, if the sacrificial layer is not damaged, the sacrificial layer can block moisture and oxygen because it is made of an inorganic material. Therefore, capability to block moisture and oxygen of the display panel is improved.

In one embodiment, the material of the sacrificial layer includes an organic material. To prevent the sacrificial layer from affecting the display panel as much as possible, the sacrificial layer may be made of an organic material.

In one embodiment, a thickness range of the sacrificial layer is one-tenth to one-fifth of the thickness of the first flexible layer. Considering that the sacrificial layer may affect a thickness of the display panel, the sacrificial layer may be designed to be relatively thin. For example, the thickness of the sacrificial layer is one-eighth of the thickness of the first flexible layer. Therefore, the sacrificial layer can be stripped off as much as possible when the glass is stripped off by laser, so that it will not be retained on the display panel. The sacrificial layer is thick enough to protect the first flexible layer, thereby preventing the first flexible layer from being damaged.

In on embodiment, as shown in FIG. 4, a barrier layer 41 is disposed between the sacrificial layer 40 and the first flexible layer 421. By the above arrangement, the barrier layer can protect the first flexible layer even if the sacrificial layer is damaged, thereby preventing the first flexible layer from being damaged when the glass is stripped off by laser. Furthermore, the barrier layer can improve adhesion of the first flexible layer, thereby preventing the first flexible layer from being peeled off.

In one embodiment, a thickness range of the barrier layer is one-tenth to one-fifth of the thickness of the first flexible layer. The barrier layer may be relatively thin to prevent the display panel from being overly thick. For example, the thickness of the barrier layer is one-tenth of the thickness of the first flexible layer, thereby protecting the first flexible layer. Furthermore, because the barrier layer is relatively thin, the total thickness of the display panel is slightly affected.

In one embodiment, a material of the barrier layer includes at least one of silicon dioxide or silicon nitride. By using silicon dioxide to form the barrier layer, not only can the first flexible layer be protected by the silicon nitride, but also capability to prevent moisture and oxygen of the display panel can be improved due to the silicon nitride.

In one embodiment, a material of the first block layer includes at least one of silicon oxide or silicon nitride. By using silicon oxide, silicon nitride, or a stacked layer thereof to form the first block layer, moisture and oxygen can be blocked.

In one embodiment, a material of the second block layer includes at least one of silicon oxide or silicon nitride. By using silicon oxide, silicon nitride, or a stacked layer thereof to form the second block layer, moisture and oxygen can be blocked. When a structure including the first flexible layer, the first block layer, the second flexible layer, and the second block is used to block moisture and oxygen, the first block layer and the second block layer are made of an inorganic material, and the material of the first block layer and the material of the second block layer may be the same or different. Therefore, moisture and oxygen can be blocked by the first block layer, the second block layer, and the second flexible layer. In addition, flexibility of the display panel can be improved due to the first flexible layer and the second flexible layer, and bendability of the display panel can be improved as well.

In one embodiment, as shown in FIG. 4, the driving circuit layer 43 includes a buffer layer 431, an active layer 432 disposed on the buffer layer 431, a gate insulating layer 433 disposed on the active layer 432, a gate layer 434 disposed on the gate insulating layer 433, an interlayer insulating layer 435 disposed on the gate layer 434, a source/drain layer 436 disposed on the interlayer insulating layer 435, and a planarization layer 437 disposed on the source/drain layer 436. In the display panel provided by the present embodiment, the driving circuit layer may be formed from a thin-film transistor (TFT) having one gate layer or two gate layers, and the TFT may be a top-gate TFT or a bottom-gate TFT.

In one embodiment, a recess is defined on the first flexible layer. Apart from the above-mentioned method (an internal stress of the first flexible layer and an internal stress of the second flexible layer eliminate each other), defining the recess on the first flexible layer to reduce the internal stress of the first flexible layer may also prevent warpage from occurring on the display panel due to the internal stress of the flexible layer.

In one embodiment, a recess is defined on the second flexible layer. Apart from the above-mentioned method (an internal stress of the first flexible layer and an internal stress of the second flexible layer eliminate each other), defining the recess on the second flexible layer to reduce the internal stress of the second flexible layer may also prevent warpage from occurring on the display panel due to the internal stress of the flexible layer.

In one embodiment, both the first flexible layer and the second flexible layer are provided with a recess. By defining the recesses on the first flexible layer and the second flexible layer, the internal stress of the first flexible layer and the internal stress of the second flexible layer can be reduced. Furthermore, by allowing the internal stress of first flexible layer and the internal stress of the second flexible layer to eliminate each other, warpage can be prevented from occurring on the display panel.

In one embodiment, the first flexible layer is provided with a first recess, and the second flexible layer is provided with a second recess. A material of the first flexible layer is yellow polyimide, and a material of the second flexible layer is colorless polyimide. The first recess is filled with colorless polyimide, and the second recess is filled with yellow polyimide. Specifically, in the present embodiment, the recesses are defined to reduce the internal stress of the first flexible layer and the internal stress of the second flexible layer. Meanwhile, colorless polyimide is filled in yellow polyimide of the first flexible layer, and yellow polyimide is filled in colorless polyimide of the second flexible layer. Therefore, the internal stress of the first flexible layer and the internal stress of the second flexible layer can be in part or even completely eliminated by themselves. Furthermore, the direction of the internal stress of the first flexible layer and the direction of the internal stress of the second flexible layer are opposite, so that the internal stress of the first flexible layer and the internal stress of the second flexible layer can eliminate each other, thereby preventing warpage from occurring on the display panel.

In one embodiment, as shown in FIG. 4, the display panel further includes a pixel electrode layer 44, an insulating layer 45, and a common electrode layer 47. When the small-sized LED chip is connected to a plurality of electrodes, as shown in FIG. 4, two electrodes may be respectively disposed at two ends of the small-sized LED chip, and may be respectively connected to the pixel electrode layer and the common electrode layer. The pixel electrode, the common electrode layer, and the small-sized LED chip are disposed on the same side, thereby allowing two electrodes of the small-sized LED chip to be connected to the pixel electrode layer and the common electrode layer. As a result, a luminescent function of the small-sized LED chip can be realized.

Figure 6:
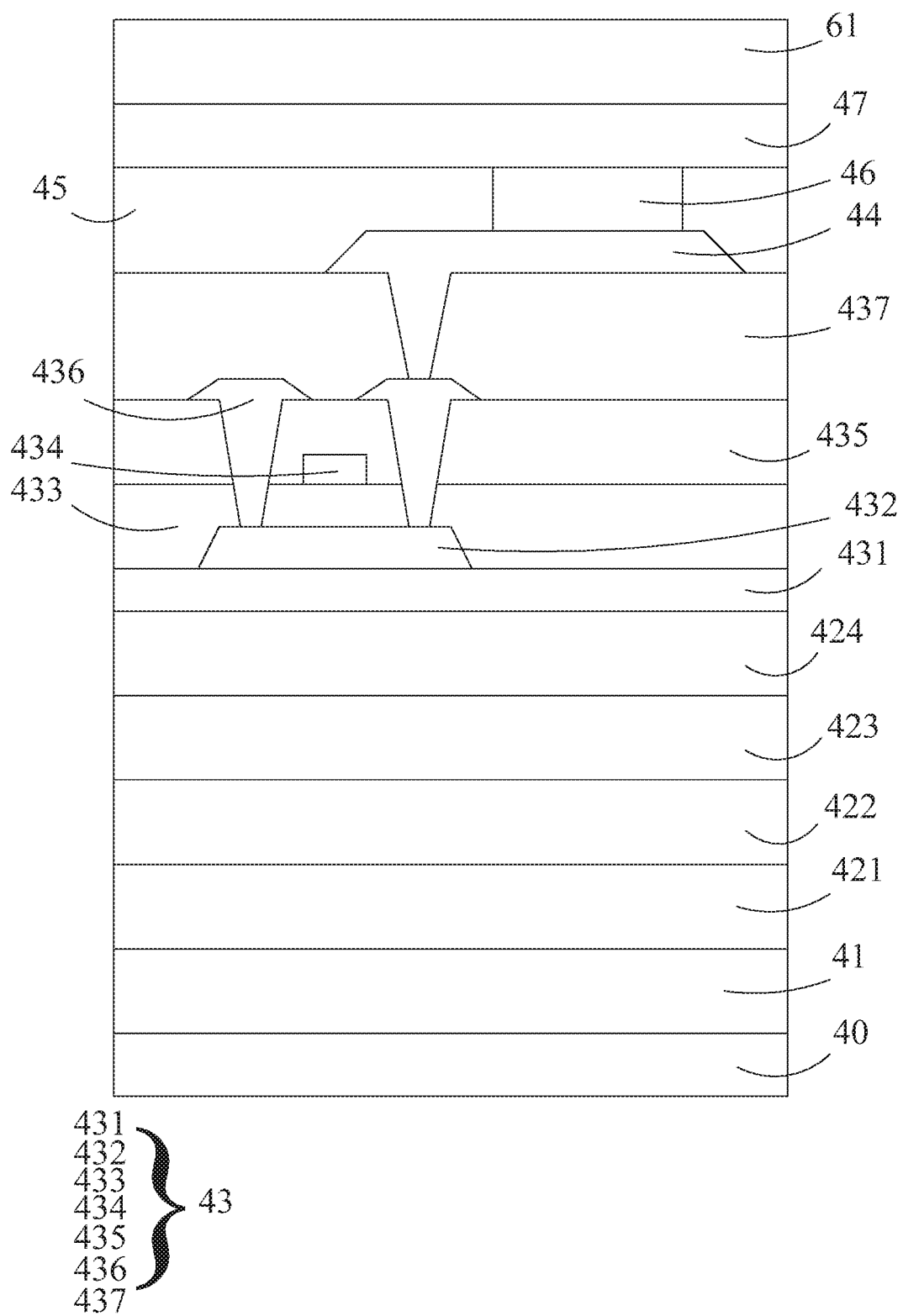
FIG. 6 is a schematic view showing a display device provided by an embodiment of the present disclosure.

As shown in FIG. 6, an embodiment of the present disclosure provides a display device, including a display panel and a cover plate 61, wherein the display panel includes:
  a sacrificial layer 40;
  a first flexible layer 421 disposed on the sacrificial layer 40;
  a first block layer 422 disposed on the first flexible layer 421;
  a second flexible layer 423 disposed on the first block layer 422;
  a second block layer 424 disposed on the second flexible layer 423;
  a driving circuit layer 43 disposed on the second block layer 424;
  a small-sized LED chip 46 disposed on the driving circuit layer 43;
  wherein a material of the first flexible layer 421 and a material of the second flexible layer 423 are different, and a direction of an internal stress of the first flexible layer 421 is opposite to a direction of an internal stress of the second flexible layer 423.

An embodiment of the present disclosure provides a display device, including a display panel and a cover plate. The display panel includes a sacrificial layer, a first flexible layer, a first block layer, a second flexible layer, a second block layer, and a driving circuit layer. The first flexible layer is disposed on the sacrificial layer, the first block layer is disposed on the first flexible layer, the second flexible layer is disposed on the first block layer, the second block layer is disposed on the second flexible layer, the driving circuit layer is disposed on the second block layer, and a small-sized LED chip is disposed on the driving circuit layer. A material of the first flexible layer and a material of the second flexible layer are different, and a direction of an internal stress of the first flexible layer is opposite to a direction of an internal stress of the second flexible layer.

Therefore, when the display panel is manufactured, the internal stress of the first flexible layer and the internal stress of the second flexible layer eliminate each other, so that the first flexible layer and the second flexible layer will not be curled, and warpage will not occur on the display panel. In addition, due to the sacrificial layer, the first flexible layer is prevented from being carbonized. As a result, a following technical problem is solved: in conventional micro-LED display panels, yellow polyimide may be curled, resulting in warpage of the micro-LED display panels.

In one embodiment, the small-sized LED chip includes a micro-LED chip or a mini-LED chip.

In one embodiment, the material of the first flexible layer includes yellow polyimide, and the material of the second flexible layer includes colorless polyimide.

In one embodiment, the material of the first flexible layer includes colorless polyimide, and the material of the second flexible layer includes yellow polyimide.

In one embodiment, a thickness of the first flexible layer is greater than or equal to a thickness of the second flexible layer.

In one embodiment, a material of the sacrificial layer includes one of silicon oxide, silicon nitride, amorphous silicon, or indium tin oxide.

In one embodiment, a thickness range of the sacrificial layer is one-tenth to one-fifth of a thickness of the first flexible layer.

In one embodiment, a barrier layer is disposed between the sacrificial layer and the first flexible layer.

In one embodiment, a thickness range of the barrier layer is one-tenth to one-fifth of a thickness of the first flexible layer.

In one embodiment, a material of the barrier layer includes silicon dioxide.

An embodiment of the present disclosure provides a method of manufacturing a display panel, including the following steps:
providing a glass substrate;
forming a sacrificial layer on the glass substrate;
forming a barrier layer on the sacrificial layer;
forming a first flexible layer on the barrier layer;
forming a first block layer on the first flexible layer;
forming a second flexible layer on the first block layer, wherein a material of the first flexible layer and a material of the second flexible layer are different, and a direction of an internal stress of the first flexible layer and a direction of an internal stress of the second flexible layer are opposite;
forming a second block layer on the second flexible layer;
forming a driving circuit layer on the second block layer;
forming a small-sized LED chip on the driving circuit layer; and
stripping off the glass substrate by laser.

A display panel and a manufacturing method thereof are provided. By disposing a sacrificial layer under a first flexible layer, the first flexible layer can be protected by the sacrificial layer when a glass substrate is stripped off by laser. Only the sacrificial layer will be damaged by laser, or will not even be damaged. Furthermore, a material of the first flexible layer and a material of the second flexible layer are different, and a direction of an internal stress of the first flexible layer is opposite to a direction of an internal stress of the second flexible layer. Therefore, the internal stress of the first flexible layer and the internal stress of the second flexible layer can eliminate each other. As a result, the first flexible layer and the second flexible layer will not be curled, so that warpage will not occur on the display panel. As such, a following technical problem is solved: in conventional micro-LED display panels, yellow polyimide may be curled, resulting in warpage of the micro-LED display panels.

According to the above embodiments:
a display panel and a display device are provided. The display panel includes a sacrificial layer, a first flexible layer, a first block layer, a second flexible layer, a second block layer, and a driving circuit layer. The first flexible layer is disposed on the sacrificial layer, the first block layer is disposed on the first flexible layer, the second flexible layer is disposed on the first block layer, the second block layer is disposed on the second flexible layer, the driving circuit layer is disposed on the second block layer, and a small-sized LED chip is disposed on the driving circuit layer. A material of the first flexible layer and a material of the second flexible layer are different, and a direction of an internal stress of the first flexible layer is opposite to a direction of an internal stress of the second flexible layer. Therefore, when the display panel is manufactured, the internal stress of the first flexible layer and the internal stress of the second flexible layer eliminate each other, so that the first flexible layer and the second flexible layer will not be curled, and warpage will not occur on the display panel. In addition, due to the sacrificial layer, the first flexible layer is prevented from being carbonized. As a result, a following technical problem is solved: in conventional micro-LED display panels, yellow polyimide may be curled, resulting in warpage of the micro-LED display panels.

In summary, many changes and modifications to the described embodiment can be carried out by those skilled in the art, and all such changes and modifications are intended to be included within the scope of the appended claims.

What is claimed is:

1. A display panel, comprising:
a sacrificial layer;
a first flexible layer disposed on the sacrificial layer;
a first block layer disposed on the first flexible layer;
a second flexible layer disposed on the first block layer;
a second block layer disposed on the second flexible layer;
a driving circuit layer disposed on the second block layer; and
a small-sized light-emitting diode (LED) chip disposed on the driving circuit layer;
wherein a material of the first flexible layer and a material of the second flexible layer are different, and a direction of an internal stress of the first flexible layer is opposite to a direction of an internal stress of the second flexible layer; and
wherein a material of the sacrificial layer comprises one of silicon oxide, silicon nitride, or indium tin oxide.

2. The display panel of claim 1, wherein the material of the first flexible layer comprises yellow polyimide, and the material of the second flexible layer comprises colorless polyimide.

3. The display panel of claim 1, wherein the material of the first flexible layer comprises colorless polyimide, and the material of the second flexible layer comprises yellow polyimide.

4. The display panel of claim 3, wherein a thickness of the first flexible layer is greater than or equal to a thickness of the second flexible layer.

5. The display panel of claim 1, wherein a thickness range of the sacrificial layer is one-tenth to one-fifth of a thickness of the first flexible layer.

6. The display panel of claim 1, wherein a barrier layer is disposed between the sacrificial layer and the first flexible layer.

7. The display panel of claim 6, wherein a thickness range of the barrier layer is one-tenth to one-fifth of a thickness of the first flexible layer.

8. The display panel of claim 6, wherein a material of the barrier layer comprises silicon dioxide.

9. The display panel of claim 1, wherein a material of the first block layer comprises at least one of silicon oxide or silicon nitride.

10. A display device, comprising a display panel and a cover plate, wherein the display panel comprises:
- a sacrificial layer;
- a first flexible layer disposed on the sacrificial layer;
- a first block layer disposed on the first flexible layer;
- a second flexible layer disposed on the first block layer;
- a second block layer disposed on the second flexible layer;
- a driving circuit layer disposed on the second block layer; and
- a small-sized light-emitting diode (LED) chip disposed on the driving circuit layer;
- wherein a material of the first flexible layer and a material of the second flexible layer are different, and a direction of an internal stress of the first flexible layer is opposite to a direction of an internal stress of the second flexible layer; and wherein a material of the sacrificial layer comprises one of silicon oxide, silicon nitride, or indium tin oxide.

11. The display device of claim 10, wherein the small-sized LED chip comprises a micro light-emitting diode (micro-LED) chip or a mini light-emitting diode (mini-LED) chip.

12. The display device of claim 10, wherein the material of the first flexible layer comprises yellow polyimide, and the material of the second flexible layer comprises colorless polyimide.

13. The display device of claim 10, wherein the material of the first flexible layer comprises colorless polyimide, and the material of the second flexible layer comprises yellow polyimide.

14. The display device of claim 13, wherein a thickness of the first flexible layer is greater than or equal to a thickness of the second flexible layer.

15. The display device of claim 10, wherein a thickness range of the sacrificial layer is one-tenth to one-fifth of a thickness of the first flexible layer.

16. The display device of claim 10, wherein a barrier layer is disposed between the sacrificial layer and the first flexible layer.

17. The display device of claim 16, wherein a thickness range of the barrier layer is one-tenth to one-fifth of a thickness of the first flexible layer.

18. The display device of claim 16, wherein a material of the barrier layer comprises silicon dioxide.

* * * * *